United States Patent
Lee et al.

(10) Patent No.: US 10,971,234 B2
(45) Date of Patent: Apr. 6, 2021

(54) PAGE BUFFER, A MEMORY DEVICE HAVING PAGE BUFFER, AND A METHOD OF OPERATING THE MEMORY DEVICE

(71) Applicant: SK hynix Inc., Icheon-si (KR)

(72) Inventors: Jung Hwan Lee, Osan-si (KR); Jung Mi Ko, Icheon-si (KR); Ji Hwan Kim, Seoul (KR); Kwang Ho Baek, Icheon-si (KR); Young Don Jung, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/670,764

(22) Filed: Oct. 31, 2019

(65) Prior Publication Data
US 2020/0321058 A1     Oct. 8, 2020

(30) Foreign Application Priority Data

Apr. 8, 2019   (KR) .................. 10-2019-0041029

(51) Int. Cl.
| | |
|---|---|
| *G11C 16/24* | (2006.01) |
| *G11C 16/34* | (2006.01) |
| *G11C 16/30* | (2006.01) |
| *G11C 16/10* | (2006.01) |
| *G11C 16/08* | (2006.01) |
| *G11C 11/56* | (2006.01) |
| *G11C 16/04* | (2006.01) |

(52) U.S. Cl.
CPC .............. *G11C 16/24* (2013.01); *G11C 16/08* (2013.01); *G11C 16/10* (2013.01); *G11C 16/30* (2013.01); *G11C 16/3404* (2013.01); *G11C 16/3409* (2013.01); *G11C 16/3459* (2013.01); *G11C 11/5628* (2013.01); *G11C 16/0483* (2013.01)

(58) Field of Classification Search
CPC ......... G11C 16/24; G11C 16/10; G11C 16/08; G11C 16/30; G11C 16/3404; G11C 16/3409; G11C 16/3459; G11C 16/0483; G11C 11/5628
USPC ....................... 365/185.28, 185.25
See application file for complete search history.

(56) References Cited

U.S. PATENT DOCUMENTS

| | | | |
|---|---|---|---|
| 7,145,806 B2* | 12/2006 | Kawai .............. | G11C 16/12 |
| | | | 365/185.25 |
| 8,233,327 B2* | 7/2012 | Wang ............. | G11C 16/3459 |
| | | | 365/185.22 |

(Continued)

FOREIGN PATENT DOCUMENTS

| | | |
|---|---|---|
| KR | 101719309 B1 | 4/2017 |
| KR | 1020180029200 A | 3/2018 |

*Primary Examiner* — Son L Mai
(74) *Attorney, Agent, or Firm* — William Park & Associates Ltd.

(57) ABSTRACT

Provided herein are a page buffer, a memory device having the page buffer, and a method of operating the memory device. The memory device includes a voltage generator configured to generate operating voltages for operating a plurality of memory cells, a program and verify circuit configured to apply the operating voltages to word lines and bit lines coupled to the memory cells and to perform a program operation and a verify operation, and a program operation controller configured to control the program and verify circuit and the voltage generator so that a bit line precharge operation is performed and so that, when the bit line precharge operation has been completed, a bit line discharge operation is performed.

20 Claims, 10 Drawing Sheets

(56) References Cited

U.S. PATENT DOCUMENTS

| | | | |
|---|---|---|---|
| 8,395,940 B2* | 3/2013 | Huh | G11C 16/06 |
| | | | 365/185.12 |
| 8,593,864 B2* | 11/2013 | Rho | G11C 16/10 |
| | | | 365/185.03 |
| 9,159,432 B2* | 10/2015 | Lee | G11C 16/24 |

* cited by examiner

FIG. 4
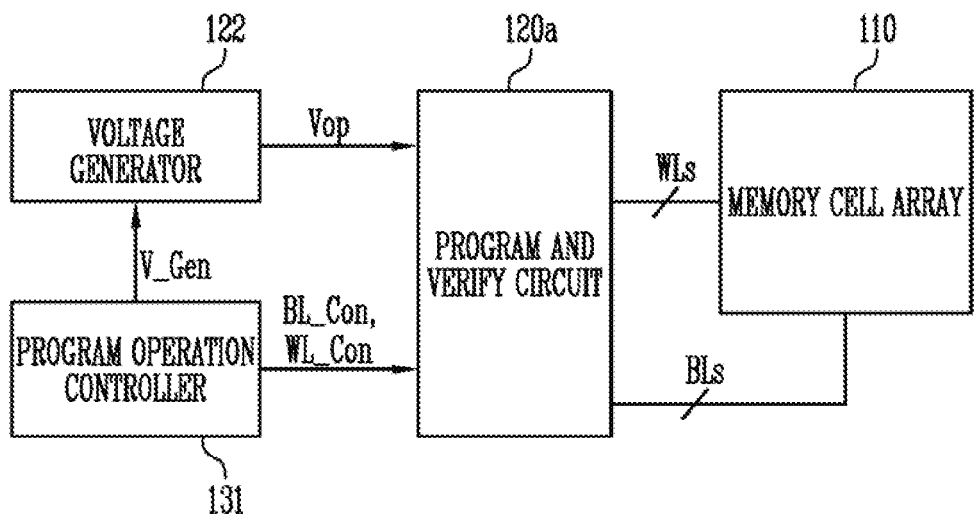
FIG. 5
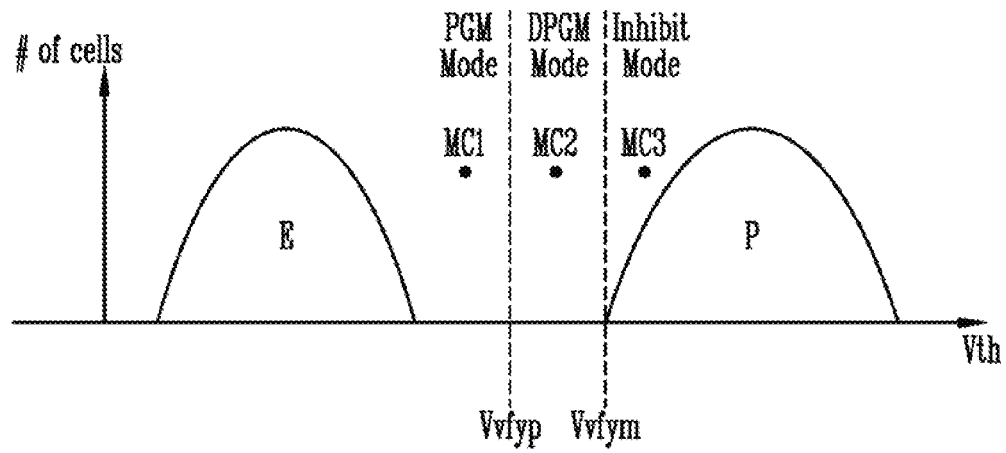
FIG. 6
| Vvfyp \ Vvfym | On | Off |
|---|---|---|
| On | PGM Mode | X |
| Off | DPGM Mode | Inhibit Mode |

PAGE BUFFER, A MEMORY DEVICE HAVING PAGE BUFFER, AND A METHOD OF OPERATING THE MEMORY DEVICE

CROSS-REFERENCE TO RELATED APPLICATION

The present application claims priority under 35 U.S.C. § 119(a) to Korean patent application number 10-2019-0041029, filed on Apr. 8, 2019, in the Korean Intellectual Property Office, the entire disclosure of which is incorporated herein by reference.

BACKGROUND

1. Technical Field

Various embodiments of the present disclosure generally relate to an electronic device, and more particularly, to a page buffer, a memory device having the page buffer, and a method of operating the memory device.

2. Related Art

A storage device is a device which stores data under the control of a host device, such as a computer or a smartphone. The storage device may include a memory device in which data is stored and a memory controller which controls the memory device. Such memory devices are generally classified as volatile memory devices and nonvolatile memory devices.

A nonvolatile memory device, which is a memory device in which stored data is not lost even when power is interrupted, may include memory cells and may perform a program operation of storing data in the memory cells, a read operation of reading stored data, and an erase operation of deleting the stored data.

A page buffer circuit may be coupled to memory cells through bit lines and may include latch circuits which temporarily store data to be stored in the memory cells. During a program operation, voltages may be applied to bit lines coupled to the memory cells through the page buffer circuit.

SUMMARY

Various embodiments of the present disclosure are directed to a page buffer having improved program operation performance, a memory device including the page buffer, and a method of operating the memory device.

In accordance with an embodiment of the present disclosure, a memory device includes a voltage generator configured to generate operating voltages for operating a plurality of memory cells. The memory device also includes a program and verify circuit configured to apply the operating voltages to respective word lines and bit lines coupled to the plurality of memory cells and configured to perform a program operation and a verify operation on the plurality of memory cells. The memory device further includes a program operation controller configured to control the program and verify circuit and the voltage generator to perform a bit line precharge operation and to perform a bit line discharge operation after the bit line precharge operation has been completed. The bit line precharge operation increases a potential of a bit line coupled to a program-inhibited cell, among the plurality of memory cells, to a program inhibition voltage and increases potentials of bit lines coupled to first and second program cells to a first program permission voltage. The bit line discharge operation decreases the potential of the bit line coupled to the first program cell to a second program permission voltage.

In accordance with another embodiment of the present disclosure, a method of operating a memory device for performing a program operation on a plurality of memory cells includes performing a bit line precharge operation of increasing potentials of bit lines coupled to first and second program cells, among the plurality of memory cells, to a first program permission voltage. The method also includes performing, after completion of the bit line precharge operation, a bit line discharge operation of decreasing a potential of a bit line coupled to the first program cell to a second program permission voltage.

In accordance with a further embodiment of the present disclosure, a page buffer circuit includes a bit line voltage controller configured to control a voltage of a bit line coupled to a memory cell during a program operation on the memory cell. The page buffer circuit also includes a latch group configured to store data corresponding to a state mode of the memory cell determined based on a result of verifying the program operation. The bit line voltage controller is configured to, when the latch group stores data corresponding to program modes among state modes, precharge the bit line to a first program permission voltage and discharge the bit line to a second program permission voltage depending on the data before a program pulse is applied to a word line coupled to the memory cell.

BRIEF DESCRIPTION OF THE DRAWINGS

FIG. 4 is a diagram illustrating the configuration and operation of the memory device of FIG. 2 according to an embodiment.

FIG. 5 is a diagram illustrating a DPGM operation according to an embodiment.

FIG. 6 is a table illustrating a state mode according to an embodiment.

DETAILED DESCRIPTION

Specific structural or functional descriptions in the present disclosure serve as embodiments of the present disclosure. These descriptions should not be construed as limiting the present disclosure.

Hereinafter, embodiments of the present disclosure are described in detail with reference to the accompanying drawings.

Figure 1:
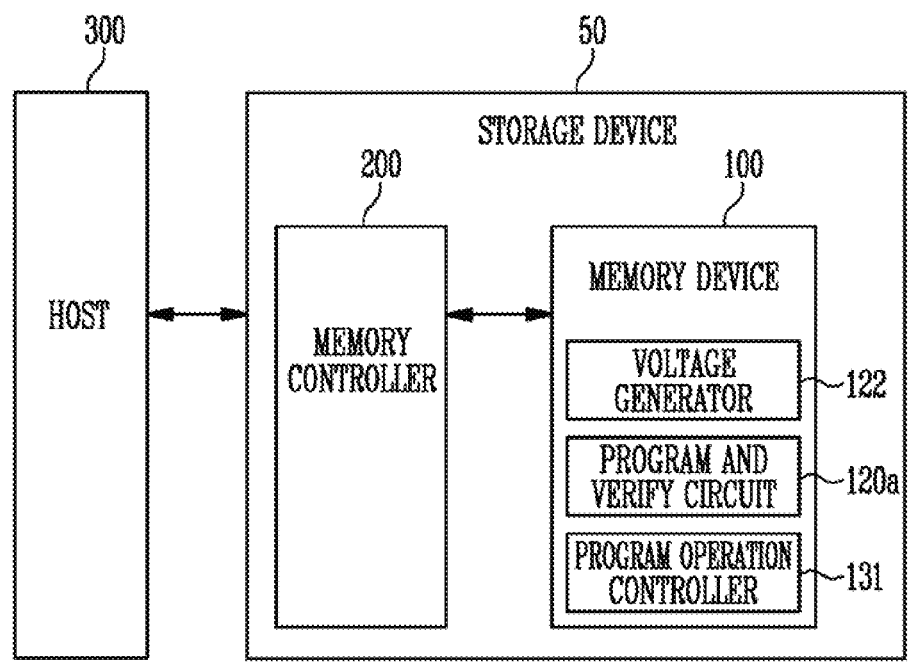
FIG. 1 is a diagram illustrating a storage device according to an embodiment of the present disclosure.

FIG. 1 is a diagram illustrating a storage device 50 according to an embodiment of the present disclosure.

Referring to FIG. 1, the storage device 50 may include a memory device 100 and a memory controller 200 which controls the operation of the memory device 100. The storage device 50 may be a device which stores data under the control of a host 300, such as a mobile phone, a smartphone, an MP3 player, a laptop computer, a desktop computer, a game console, a television (TV), a tablet PC, or an in-vehicle infotainment system.

The memory device 100 may store data. The memory device 100 is operated in response to the control of the memory controller 200. The memory device 100 may include a memory cell array including a plurality of memory cells which store data.

Each of the memory cells may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. A single memory block may include a plurality of pages. In an embodiment, a page may be a unit by which data is stored in the memory device 100 or by which data stored in the memory device 100 is read. A memory block may be a unit by which data is erased.

In an embodiment, the memory device 100 may be implemented as any one of various types of memory devices. In the present specification, for convenience of description, the memory device 100 is assumed to be NAND flash memory.

The memory device 100 may receive a command and an address from the memory controller 200, and may access an area, selected by the address, in the memory cell array. That is, the memory device 100 may perform an operation corresponding to the command on the area selected by the address. For example, the memory device 100 may perform a write operation (program operation), a read operation, or an erase operation. During a program operation, the memory device 10 may program data to the area selected by the address. During a read operation, the memory device 100 may read data from the area selected by the address. During an erase operation, the memory device 100 may erase data stored in the area selected by the address.

In an embodiment, the memory device 100 may include a program and verify circuit 120a, a voltage generator 122, and a program operation controller 131.

The program and verify circuit 120a may perform a program operation or a verify operation on memory cells under the control of the program operation controller 131. The program and verify circuit 120a may apply operating voltages to respective bit lines and word lines coupled to the memory cells under the control of the program operation controller 131.

The program and verify circuit 120a may apply a program voltage to a selected word line coupled to memory cells in order to perform a program operation. The program and verify circuit 120a may apply a program permission voltage to a bit line coupled to a cell on which a program operation is currently being performed, among the memory cells coupled to the selected word line. The program and verify circuit 120a may apply a program inhibition voltage to a bit line coupled to a cell on which a program operation has been completed, among the memory cells coupled to the selected word line.

The program and verify circuit 120a may perform a verify operation on the memory cells, on which the program operation has been performed, using a pre-verify voltage or a main verify voltage under the control of the program operation controller 131. The program and verify circuit 120a may apply the pre-verify voltage or the main verify voltage to the word line coupled to the memory cells, on which the program operation has been performed, in order to perform a verify operation. In an embodiment, as a result of performing the verify operation, a memory cell, a threshold voltage of which is lower than the pre-verify voltage, may be a first program cell. A memory cell, a threshold voltage of which is higher than the pre-verify voltage and is lower than the main verify voltage, may be a second program cell. A memory cell, a threshold voltage of which is higher than the main verify voltage, may be a program-inhibited cell.

The voltage generator 122 may generate operating voltages used for operating the memory cells. Among the operating voltages, a voltage that is applied to bit lines may be a bit-line voltage, and a voltage that is applied to word lines may be a word-line voltage.

The program operation controller 131 may control the voltage generator 122 so that the voltage generator 122 generates operating voltages used for a program operation or a verify operation on the memory cells.

The program operation controller 131 may control the program and verify circuit 120a so that a program operation and a verify operation are performed on the memory cells. The program operation controller 131 may control the program and verify circuit 120a so that the operating voltages are selectively applied to respective word lines and bit lines coupled to the memory cells.

The program operation may include a bit line setup operation and a program pulse application operation. The bit line setup operation may be an operation of setting the potentials of bit lines coupled to memory cells in a selected word line to voltages used for the program operation. The bit line setup operation may include a bit line precharge operation of increasing the potentials of the bit lines and a bit line discharge operation of decreasing the potentials of the bit lines. The program pulse application operation may be an operation of applying the program voltage to the selected word line. The program pulse application operation may be performed after the bit line setup operation has been performed.

In an embodiment, the program operation controller 131 may control the voltage generator 122 so that the bit line setup operation is performed.

The program operation controller 131 may control the voltage generator 122 so that the voltage generator 122 generates bit line voltages to be applied to bit lines coupled to the memory cells in the selected word line during the bit line setup operation. The bit line voltages may include a first program permission voltage, a second program permission voltage, and a program inhibition voltage. For example, the first program permission voltage may be a voltage higher than the second program permission voltage. The second program permission voltage may be a ground voltage. In various embodiments, the second program permission voltage may be a negative voltage. The program inhibition voltage may be a voltage to be applied to a bit line coupled to a memory cell so that the memory cell is not programmed. The program inhibition voltage may be a supply voltage.

The program operation controller 131 may control the program and verify circuit 120a so that the bit line precharge operation included in bit line setup operations is performed.

The program operation controller 131 may control the program and verify circuit 120a so that the program inhibition voltage is applied to a bit line coupled to a program-inhibited cell, among the memory cells in the selected word line, during the bit line precharge operation. The program operation controller 131 may control the program and verify circuit 120a so that the first program permission voltage is applied to bit lines coupled to first and second program cells, among the memory cells in the selected word line, during the bit line precharge operation.

The program operation controller 131 may control the program and verify circuit 120a so that, when the bit line precharge operation is completed, the bit line discharge operation is performed. The program operation controller 131 may control the program and verify circuit 120a so that, during the bit line discharge operation, the second program permission voltage is applied to a bit line coupled to the first program cell.

The program operation controller 131 may control the voltage generator 122 and the program and verify circuit 120a so that the program pulse application operation is performed. The program operation controller 131 may control the voltage generator 122 so that the voltage generator 122 generates the program voltage to be applied to the selected word line in the program pulse application operation. The program operation controller 131 may control the program and verify circuit 120a so that the program voltage is applied to the selected word line.

The memory controller 200 controls the overall operation of the storage device 50.

When power is applied to the storage device 50, the memory controller 200 may run firmware (FW). When the memory device 100 is a flash memory device, the memory controller 200 may run firmware such as a Flash Translation Layer (FTL) for controlling communication between the host 300 and the memory device 100.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored.

The memory controller 200 may control the memory device 100 so that a program operation, a read operation, or an erase operation is performed in response to a request received from the host 300. During a program operation, the memory controller 200 may provide a program command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may autonomously generate a program command, an address, and data, regardless of whether a request from the host 300 is received, and may transmit them to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control at least two memory devices 100. In this case, the memory controller 200 may control the memory devices 100 depending on an interleaving scheme to improve operation performance. The interleaving scheme may be an operating manner in which the operating periods of at least two memory devices 100 are caused to overlap each other.

Figure 2:
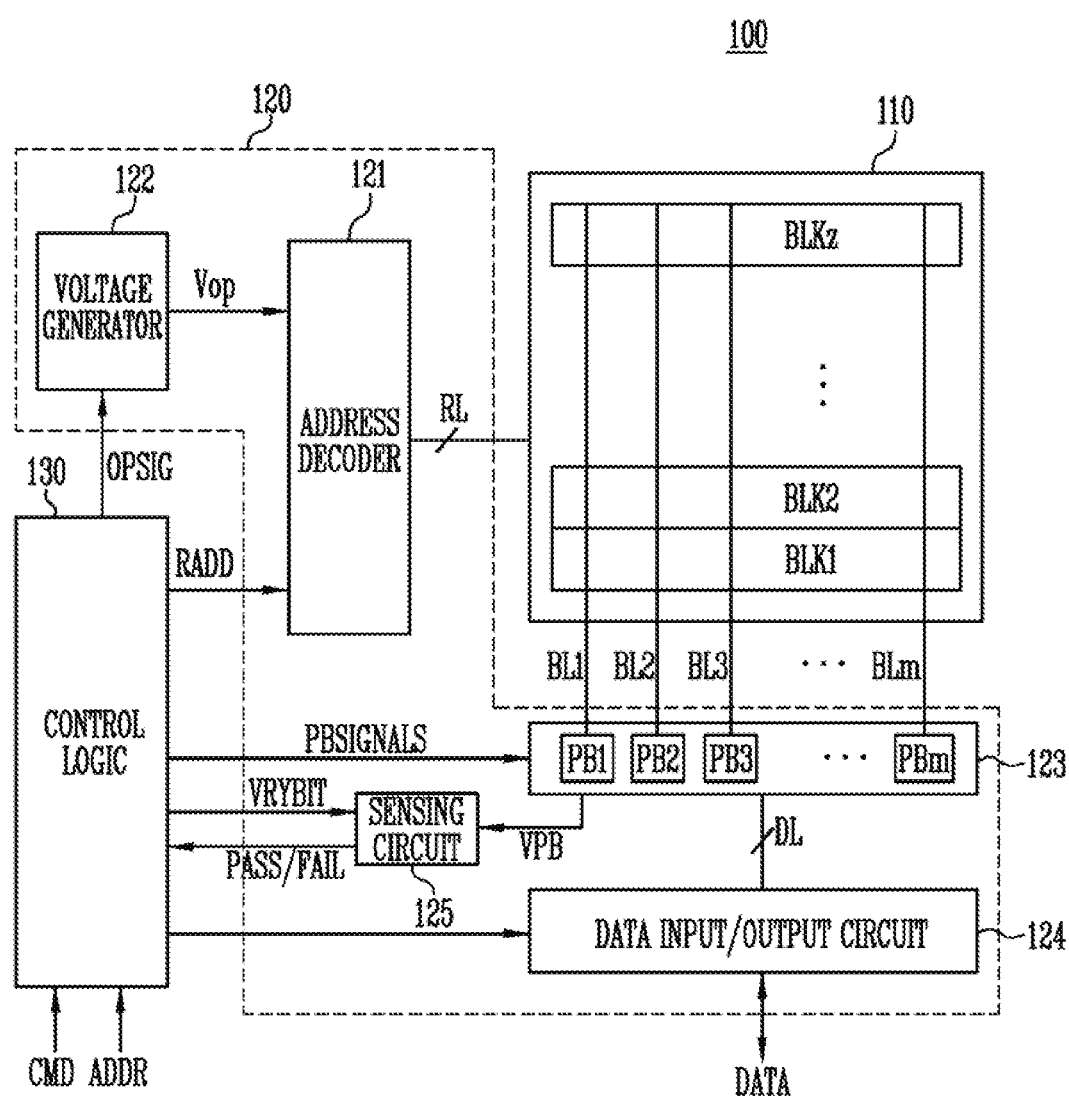
FIG. 2 is a diagram illustrating the structure of a memory device of FIG. 1.

FIG. 2 is a diagram illustrating the structure of the memory device 100 of FIG. 1.

The memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single physical page. That is, the memory cell array 110 is composed of a plurality of physical pages. In accordance with an embodiment of the present disclosure, each of the plurality of memory blocks BLK1 to BLKz included in the memory cell array 110 may include a plurality of dummy cells. As the dummy cells, one or more dummy cells may be coupled in series between a drain select transistor and the memory cells and between a source select transistor and the memory cells.

Each of the memory cells of the memory device 100 may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include the address decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In accordance with an embodiment, the word lines may include normal word lines and dummy word lines. In accordance with an embodiment, the row lines RL may further include a pipe select line.

In an embodiment, the row lines RL may be local lines included in local line groups. A local line group may correspond to a single memory block. The local line group may include a drain select line, local word lines, and a source select line.

The address decoder 121 may be operated under the control of the control logic 130. The address decoder 121 receives addresses ADDR from the control logic 130.

The address decoder 121 may decode a block address among the received addresses ADDR. The address decoder 121 selects at least one memory block from among the memory blocks BLK1 to BLKz in response to the decoded block address. The address decoder 121 is configured to decode a row address RADD among the received addresses ADDR. The address decoder 121 may select at least one word line of the selected memory block by applying voltages supplied from the voltage generator 122 to at least one word line WL in response to the decoded row address RADD.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verify pass voltage having a level higher than that of the verify voltage to unselected word lines.

During a read operation, the address decoder 121 may apply a read voltage to a selected word line and apply a read pass voltage having a level higher than that of the read voltage to unselected word lines.

In accordance with an embodiment of the present disclosure, the erase operation of the memory device 100 may be performed on a memory block basis. During an erase operation, the addresses ADDR input to the memory device 100 include a block address. The address decoder 121 may decode the block address and select a single memory block in response to the decoded block address. During the erase operation, the address decoder 121 may apply a ground voltage to word lines coupled to the selected memory block.

In accordance with an embodiment of the present disclosure, the address decoder 121 may decode a column address among the received addresses ADDR. The decoded column address may be transferred to the read and write circuit 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate the plurality of operating voltages Vop using the external supply voltage or the internal supply voltage. The voltage generator 122 may generate various voltages used by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage so as to generate a plurality of operating voltages Vop having various voltage levels, and may generate the plurality of operating voltages Vop by selectively enabling the plurality of pumping capacitors under the control of the control logic 130.

The generated operating voltages Vop may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. Memory cells in a selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibition voltage (e.g., a supply voltage) is applied may be maintained. During a program verify operation, the first to m-th page buffers PB1 to PBm read the data DATA stored in the selected memory cells from the selected memory cells through the bit lines BL1 to BLm.

During a read operation, the read and write circuit 123 may read data DATA from the memory cells in the selected page through the bit lines BL, and may store the read data DATA in the first to m-th page buffers PB1 to PBm.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated in response to the control of the control logic 130.

The data input/output circuit 124 may include a plurality of input/output buffers (not illustrated) which receive input data DATA. During a program operation, the data input/output circuit 124 receives the data DATA to be stored from an external controller (not illustrated). During a read operation, the data input/output circuit 124 outputs the data DATA, received from the first to m-th page buffers PB1 to PBm included in the read and write circuit 123, to the external controller.

During a read operation or a verify operation, the sensing circuit 125 may generate a reference current in response to an enable bit signal VRYBIT generated by the control logic 130, and may output a pass signal or a fail signal to the control logic 130 by comparing a sensing voltage VPB received from the read and write circuit 123 with a reference voltage generated by the reference current.

The control logic 130 may be coupled to the address decoder 121, the voltage generator 122, the read and write circuit 123, the data input/output circuit 124, and the sensing circuit 125. The control logic 130 may be implemented as hardware, software, or a combination of hardware and software. For example, the control logic 130 may be a control logic circuit operating in accordance with an algorithm and/or a processor executing control logic code. The control logic 130 may control the overall operation of the memory device 100. The control logic 130 may be operated in response to a command CMD transmitted from an external device.

The control circuit 130 may control the peripheral circuit 120 by generating various types of signals in response to the command CMD and the addresses ADDR. For example, the control logic 130 may generate an operation signal OPSIG, a row address RADD, a page buffer control signal PBSIGNALS, and an enable bit VRYBIT in response to the command CMD and the addresses ADDR. The control logic 130 may output the operation signal OPSIG to the voltage generator 122, output the row address RADD to the address decoder 121, output the page buffer control signal PBSIG-NALS to the read and write circuit 123, and output the enable bit VRYBIT to the sensing circuit 125. In addition, the control logic 130 may determine whether a verify operation has passed or failed in response to the pass or fail signal PASS or FAIL output from the sensing circuit 125.

Figure 3:
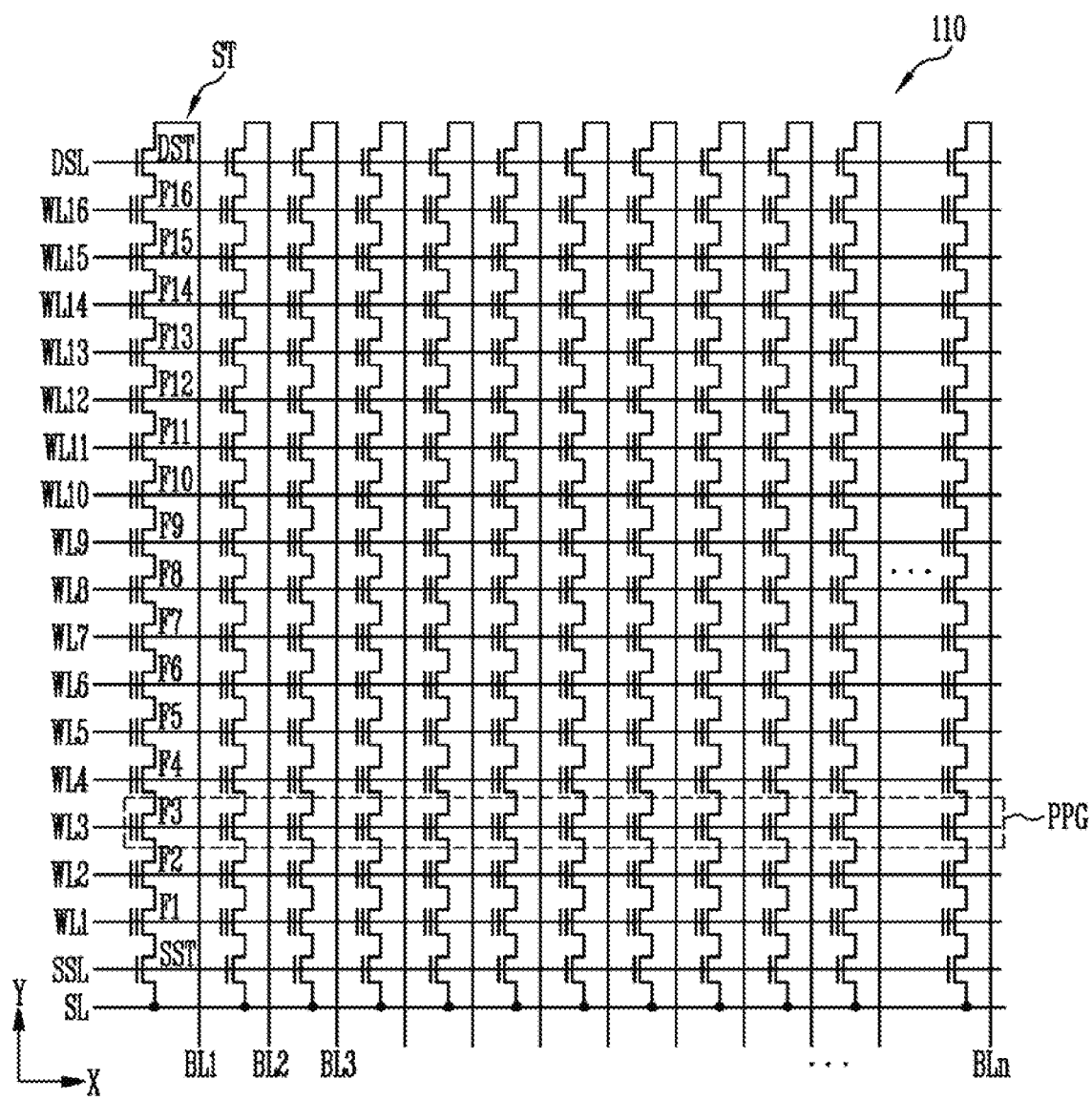
FIG. 3 is a diagram illustrating a memory block of FIG. 2.

FIG. 3 is a diagram illustrating any memory block of FIG. 2.

Referring to FIG. 3, the memory block may be coupled to a first select line, word lines, and a second select line that are coupled in parallel to each other. For example, the word lines may be coupled in parallel to each other between the first and second select lines. Here, the first select line may be a source select line SSL, and the second select line may be a drain select line DSL.

In detail, the memory block may include a plurality of strings ST coupled between bit lines BL1 to BLn and a source line SL. The bit lines BL1 to BLn may be coupled to the strings ST, respectively, and the source line SL may be coupled in common to the strings ST. Because the strings ST may be equally configured, a string ST coupled to the first bit line BL1 will be described in detail by way of example.

The memory string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block may include a number of physical pages PPG identical to the number of word lines WL1 to WL16.

One memory cell may store one bit of data. This cell is typically designated as a "single-level cell: SLC". Here, one physical page PPG may store data corresponding to one logical page LPG. The data corresponding to one logical page LPG may include a number of data bits identical to the number of memory cells included in one physical page PPG. Alternatively, one memory cell may store two or more bits of data. This cell is typically designated as a "multi-level cell: MLC". Here, one physical page PPG may store data corresponding to two or more logical pages LPG.

A memory call which stores two or more bits of data in one memory cell is designated as a "multi-level cell". However, recently, with an increase in the number of data bits stored in one memory cell, the multi-level cell (MLC) may mean a memory cell in which two bits of data are stored, a memory cell in which three or more bits of data are stored is designated as a "triple-level cell (TLC)", and a memory cell in which four or more bits of data are stored is designated as a "quad-level cell (QLC)".

FIG. 4 is a diagram illustrating the configuration and operation of the memory device 100 of FIG. 2 according to an embodiment.

Referring to FIG. 4, the memory device 100 may include a memory cell array 110, a program and verify circuit 120a, a voltage generator 122, and a program operation controller 131.

The peripheral circuit 120, described above with reference to FIG. 2, may include the program and verify circuit 120a. The program and verify circuit 120a may include the address decoder 121 and the read and write circuit 123 of FIG. 2. The control logic 130, described above with reference to FIG. 2, may include the program operation controller 131.

The memory cell array 110 may include a plurality of memory cells. The memory cell array 110 may be coupled to the program and verify circuit 120a through word lines WLs coupled to the plurality of memory cells. The memory cell array 110 may be coupled to the program and verify circuit 120a through bit lines BLs coupled to the plurality of memory cells. The word lines WLs and the bit lines BLs may intersect each other, as described with reference to FIG. 3.

The voltage generator 122 may generate operating voltages used for the operations of the memory cells in response to a voltage generation signal V_Gen. Among the operating voltages, a voltage that is applied to the word lines may be a word line voltage. Among the operating voltages, a voltage that is applied to the bit lines may be a bit line voltage.

In an embodiment, a program operation may include a bit line setup operation and a program pulse application operation.

The bit line setup operation may be an operation of setting the potentials of bit lines BLs coupled to memory cells in a selected word line to voltages used for the program operation. The bit line setup operation may include a bit line precharge operation of increasing the potentials of the bit lines and a bit line discharge operation of decreasing the potentials of the bit lines. In addition, the bit line setup operation may include a bit line floating operation of maintaining the potentials of the precharged bit lines.

The program pulse application operation may be an operation of applying the program voltage to the selected word line. The program pulse application operation may be performed after the bit line setup operation has been performed.

The voltage generator 122 may generate the program voltage to be applied to the selected word line in the program pulse application operation in response to the voltage generation signal V_Gen. The voltage generator 122 may generate bit line voltages to be applied to the bit lines BLs coupled to memory cells in the selected word line in the bit line setup operation in response to the voltage generation signal V_Gen.

In detail, the bit line voltages may include a first program permission voltage, a second program permission voltage, and a program inhibition voltage. The first program permission voltage may be a voltage higher than the second program permission voltage. The second program permission voltage may be a ground voltage. In various embodiments, the second program permission voltage may be a negative voltage. The program inhibition voltage may be a voltage to be applied to a bit line coupled to a memory cell so that the memory cell is not programmed. The program inhibition voltage may be a supply voltage.

The voltage generator 122 may supply the generated operating voltages to the program and verify circuit 120a.

The program and verify circuit 120a may be supplied with the operating voltages from the voltage generator 122. The program and verify circuit 120a may perform a program operation and a verify operation in response to a bit line control signal BL_Con and a word line control signal WL_Con.

In detail, the program operation may be an operation of increasing the threshold voltage of a memory cell to a threshold voltage corresponding to a target state depending on the data to be stored in the memory cell. The verify operation may be an operation of verifying whether the program operation on the memory cell has been successfully performed. In detail, the verify operation may be an operation of checking whether the threshold voltage of the memory cell on which the program operation has been performed has reached the threshold voltage corresponding to the target state of the program operation.

The program and verify circuit 120a may apply operating voltages to respective bit lines BLs coupled to the memory cells in response to the bit line control signal BL_Con. The program and verify circuit 120a may apply operating voltages to respective word lines WLs coupled to the memory cells in response to the word line control signal WL_Con.

The program and verify circuit 120a may perform the verify operation on the memory cells using a pre-verify voltage and a main verify voltage in response to the word line control signal WL_Con. The program and verify circuit 120a may apply the pre-verify voltage to a selected word line in response to the word line control signal WL_Con during a pre-verify operation. The program and verify circuit 120a may apply the main verify voltage to the selected word line in response to the word line control signal WL_Con during a main verify operation.

In an embodiment, the main verify voltage may be a verify voltage corresponding to the target state of the program operation. The pre-verify voltage may be a voltage for verifying the extent to which the program operation on the corresponding memory cell is being performed at a level lower than the main verify voltage.

As a result of performing the verify operation on the memory cells in the selected word line, a first program cell may be a memory cell, a threshold voltage of which is lower than the pre-verify voltage. A second program cell may be a memory cell, a threshold voltage of which is higher than the pre-verify voltage and is lower than the main verify voltage. A program-inhibited cell may be a memory cell, a threshold voltage of which is higher than the main verify voltage.

For an embodiment, when the threshold voltage of the memory cell is lower than the pre-verify voltage, the program operation on the corresponding memory cell needs to be performed at high speed. For an embodiment, when the threshold voltage of the memory cell is higher than the pre-verify voltage and is lower than the main verify voltage, the program operation on the corresponding memory cell needs to be performed at low speed. For an embodiment, when the threshold voltage of the corresponding memory cell is higher than the main verify voltage, there is a need to inhibit a program operation on the memory cell because the memory cell has been programmed to the target state.

Therefore, the program and verify circuit 120a may apply the program inhibition voltage to a bit line coupled to the program-inhibited cell, among the memory cells in the selected word line in response to the bit line control signal BL_Con during the bit line precharge operation included in the bit line setup operation. The program and verify circuit 120a may apply the first program permission voltage to the bit lines BLs coupled to first and second program cells, among the memory cells in the selected word line, in response to the bit line control signal BL_Con during the bit line precharge operation. The program and verify circuit 120a may apply the first program permission voltage to a bit line coupled to the first program cell in response to the bit line control signal BL_Con during the bit line discharge operation.

The program and verify circuit 120a may apply the program voltage to the selected word line in response to the word line control signal WL_Con during the program pulse application operation when the bit line setup operation is completed.

In an embodiment, a program operation with strength lower than that of the first program cell may be performed on the second program cell. The program strength may be determined depending on the time during which each program pulse is applied, the number of times that the program pulse is applied, and a potential difference between the program pulses. For example, during a period in which the program pulse is applied to a word line coupled in common to the first program cell and to the second program cell is applied, a ground voltage may be applied to the bit line coupled to the first program cell and a program permission voltage higher than the ground voltage may be applied to the bit line coupled to the second program cell. In this case, because the second program cell has a potential lower than that of the program pulse applied to the first program cell, a program operation with lower strength may be performed on the second program cell.

The program operation on the program-inhibited cell may be restricted. For example, while the program pulse is being applied to a word line coupled to the program-inhibited cell, the program inhibition voltage, which is a supply voltage, may be applied to the bit line coupled to the program cell. In this case, because the potential of the program pulse applied to the program-inhibited cell becomes lower than the potential for increasing the threshold voltage of the memory cell, the program operation of increasing the threshold voltage of the program-inhibited cell may be restricted.

The program operation controller 131 may provide the voltage controller with the voltage generation signal V_Gen for controlling the generation of the operating voltages used for a program operation or a verify operation.

The program operation controller 131 may provide the program and verify circuit 120a with the word line control signal WL_Con for controlling selective application of the operating voltages to respective word lines WLs coupled to memory cells. The program operation controller 131 may provide the program and verify circuit 120a with the bit line control signal BL_Con for controlling selective application of the operating voltages to respective bit lines BLs coupled to the memory cells.

In an embodiment, the program operation controller 131 may generate the bit line control signal BL_Con for controlling the bit line precharge operation of increasing the potentials of the bit lines BLs coupled to the first and second program cells to the first program permission voltage during a period for the bit line setup operation.

Before performing the program pulse application operation, the program operation controller 131 may generate the bit line control signal BL_Con for controlling a bit line floating operation which maintains the potential of the bit line coupled to the first program cell at the precharged first program-permission voltage.

Before performing the program pulse application operation, the program operation controller 131 may generate the bit line control signal BL_Con for controlling the bit line discharge operation which decreases the potential of the bit line coupled to the second program cell to the second program-permission voltage.

The program operation controller 131 may generate the word line control signal WL_Con for controlling the program pulse application operation which increases the potential of the selected word line to the program voltage when the bit line setup operation is completed.

FIG. 5 is a diagram for explaining a DPGM operation according to an embodiment.

Referring to FIG. 5, a Double verify PG (DPGM) operation may be a program operation which performs a verify operation using two verify voltage levels during an operation of verifying the program operation. The two verify voltages may be a pre-verify voltage Vvfyp and a main verify voltage Vvfym. The main verify voltage Vvfym may be a verify voltage corresponding to the target state of the program operation. The pre-verify voltage Vvfyp may be a voltage for verifying the extent to which the program operation on the corresponding memory cell is being performed at a level lower than the main verify voltage Vvfym.

In FIG. 5, a description is made on the assumption that a memory cell is a single-level cell (SLC) which stores a single data bit. The target state of the program operation on the memory cell may be a first programmed state P.

A state mode may be determined depending on the result of verifying the program operation on the memory cell. The state mode may include a first program mode (PGM Mode), a second program mode (DPGM Mode), and a program inhibit mode (Inhibit Mode).

Because a threshold voltage of a first memory cell MC1 is lower than the pre-verify voltage Vvfyp, the state mode of the first memory cell MC1 may be the first program mode (PGM Mode). Because a threshold voltage of a second memory cell MC2 is higher than the pre-verify voltage Vvfyp and is lower than the main verify voltage Vvfym, the state mode of the second memory cell MC2 may be the second program mode (DPGM Mode). Because a threshold voltage of a third memory cell MC3 is higher than the main verify voltage Vvfym, the state mode of the third memory cell MC3 may be the program inhibit mode (Inhibit Mode).

For an embodiment, in order for the first memory cell MC1 to reach the first programmed state P, which is the target state, the program operation needs to be performed at high speed. For an embodiment, in order for the second memory cell MC2 to reach the first programmed state P, which is the target state, the program operation needs to be performed at low speed. For an embodiment, because the third memory cell MC3 has been programmed to the target state P, the program operation needs to be inhibited.

Therefore, the program operation with program strength lower than that of the first memory cell MC1 may be performed on the second memory cell MC2. The program strength may be determined depending on a time during which the program pulse is applied, the number of times that the program pulse is applied, and a potential difference between program pulses.

For example, during a period in which the program pulse is applied to the word line, a ground voltage may be applied to a bit line coupled to the first memory cell MC1, and a program permission voltage higher than the ground voltage may be applied to a bit line coupled to the second memory cell MC2. In this case, because the program pulse applied to the second memory cell MC2 has a potential lower than that of the program pulse applied to the first memory cell MC1, the program operation with program strength lower than that of the first memory cell MC1 may be performed on the second memory cell MC2.

A program operation on the third memory cell MC3 may be restricted. For example, while a program pulse is being applied to the word line, the program inhibition voltage, which is a supply voltage, may be applied to a bit line coupled to the third memory cell MC3. In this case, because the potential of the program pulse applied to the third memory cell MC3 becomes lower than a potential for increasing the threshold voltage of the memory cell, the program operation of increasing the threshold voltage of the third memory cell MC3 may be restricted.

FIG. 6 is a table for explaining a state mode according to an embodiment.

Referring to FIG. 6, a state mode may be determined depending on the result of verifying a program operation on each memory cell. The state mode may include a first program mode (PGM Mode), a second program mode (DPGM Mode), and a program inhibit mode (Inhibit Mode).

In an example, "verify pass" may indicate that a memory cell is read as an off-cell by the corresponding verify voltage. "Verify fail" may indicate that a memory cell is read as an on-cell by the corresponding verify voltage. In other words, when the threshold voltage of the memory cell is lower than the verify voltage (i.e., located to the left of the verify voltage), the memory cell is read as an on-cell, whereas when the threshold voltage of the memory cell is higher than the verify voltage (i.e., located to the right of the verify voltage), the memory cell is read as an off-cell.

Referring to FIGS. 5 and 6, each memory cell, the state mode of which is the first program mode (PGM Mode), may be read as an on-cell by the pre-verify voltage Vvfyp and the main verify voltage Vvfym.

A memory cell, the state mode of which is the second program mode (DPGM Mode), may be read as an off-cell by the pre-verify voltage Vvfyp, and may be read as an on-cell by the main verify voltage Vvfym.

A memory cell, the state mode of which is the program inhibit mode (Inhibit Mode), may be read as an off-cell by each of the pre-verify voltage Vvfyp and the main verify voltage Vvfym.

Because the pre-verify voltage Vvfyp is lower than the main verify voltage Vvfym, a case where the corresponding memory cell is read as an on-cell by the pre-verify voltage Vvfyp and is read as an off-cell by the main verify voltage Vvfym is not present.

Figure 7:
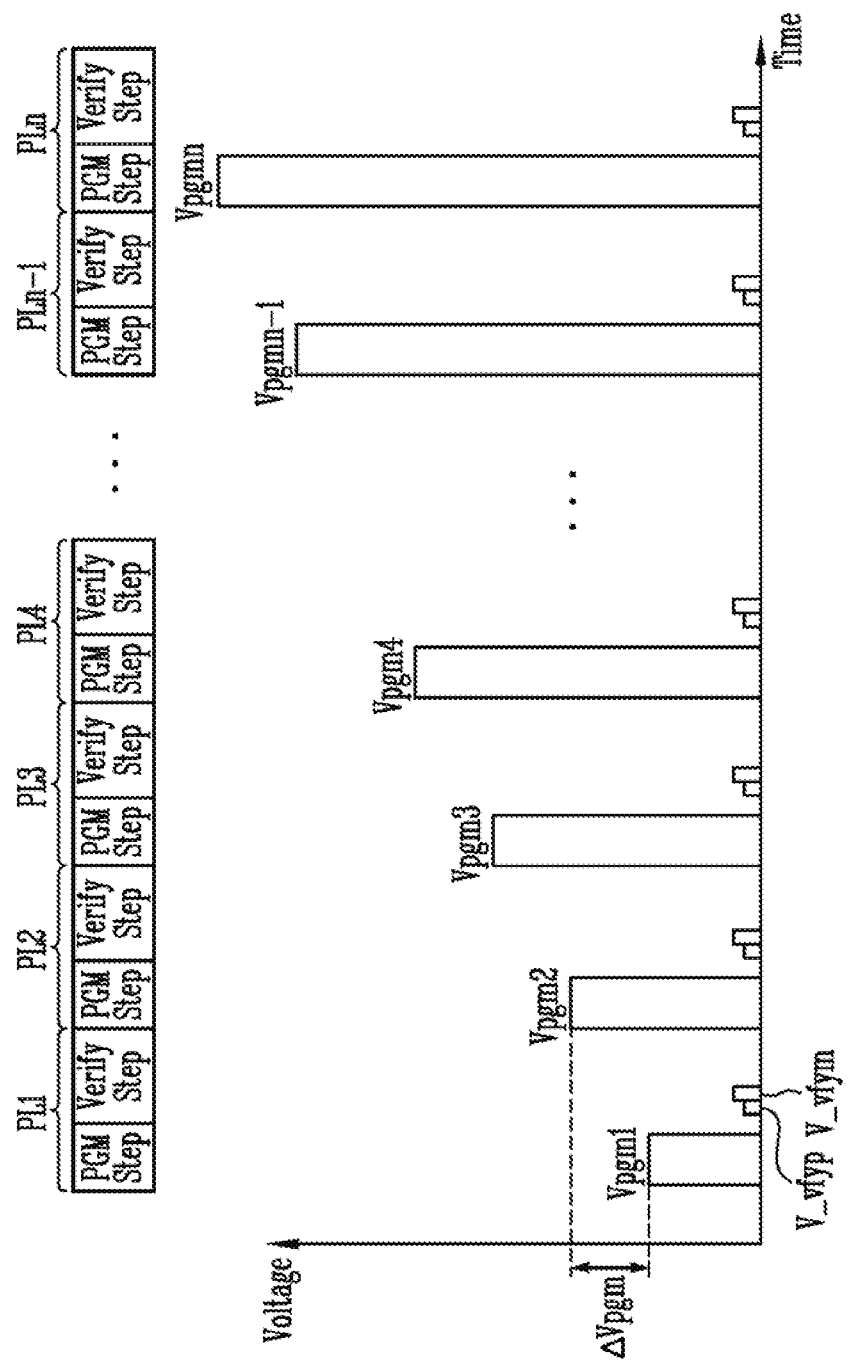
FIG. 7 is a bar diagram illustrating a program operation according to an embodiment.

FIG. 7 is a bar diagram for explaining a program operation according to an embodiment.

Referring to FIG. 7, the program operation may include a plurality of program loops PL1 to PLn.

Each of the plurality of program loops PL1 to PLn may include a program voltage application step (PGM Step) of applying a program pulse and a verify step of applying verify voltages and determining whether memory cells have been programmed.

At the verify step, each of the memory cells may be verified by a pre-verify voltage Vvfyp and a main verify voltage Vvfym. The main verify voltage Vvfym may be a verify voltage corresponding to the target state of the program operation. The pre-verify voltage Vvfyp may be a voltage for verifying the extent to which the program operation on the corresponding memory cell is being performed at a level lower than the main verify voltage Vvfym.

In an example, "verify pass" may indicate that a memory cell is read as an off-cell by the corresponding verify voltage.

"Verify fail" may indicate that a memory cell is read as an on-cell by the corresponding verify voltage.

For example, when the first program loop PL1 is performed, the pre-verify voltage Vvfyp and the main verify voltage Vvfym may be sequentially applied so as to verify the programmed states of a plurality of memory cells at the verify step after a first program pulse Vpgm1 has been applied.

In an embodiment, memory cells having failed in a verify operation (i.e., verify fail) by the pre-verify voltage Vvfyp may be identified as memory cells, the state mode of which is the first program mode (PGM Mode). Memory cells having passed the verify operation (i.e., verify pass) by the pre-verify voltage Vvfyp may be identified as memory cells, the state mode of which is the second program mode (DPGM Mode). Memory cells having passed the verify operation (i.e., verify pass) by the main verify voltage Vvfym may be identified as memory cells, the state mode of which is the program inhibit mode (Inhibit Mode). Memory cells, the state mode of which is the program inhibit mode, may be program-inhibited in the second program loop PL2.

In the second program loop PL2, in order to program memory cells other than the program-inhibited cells, a second program pulse Vpgm2 higher than the first program pulse Vpgm1 by a unit voltage of ΔVpgm may be applied. Thereafter, the verify operation is performed in the same way as the verify operation of the first program loop PL1.

As described above, the memory device may verify which one of the first program mode, the second program mode, and the program inhibit mode corresponds to the state mode of each memory cell using the pre-verify voltage Vvfyp and the main verify voltage Vvfym. The memory device may set a voltage that is applied to a bit line coupled to each memory cell to different voltages during a program operation depending on the state mode of the memory cell.

At the verify voltage, the verify voltage may be applied to a selected word line, which is the word line coupled to the selected memory cells, and a page buffer may determine whether memory cells have passed the verify operation based on currents or voltages flowing through the bit lines respectively coupled to the selected memory cells.

Figure 8:
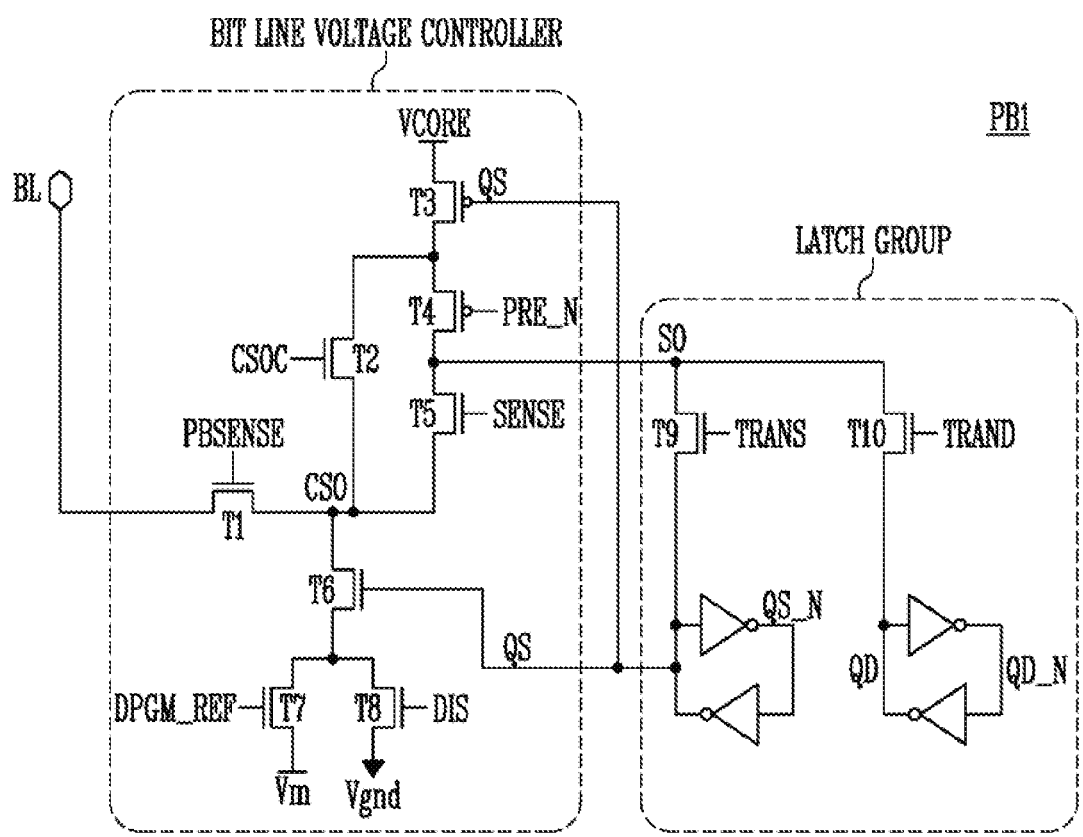
FIG. 8 is a diagram illustrating the configuration and operation of a page buffer circuit according to an embodiment.

FIG. 8 is a diagram illustrating a configuration and operation of a page buffer circuit according to an embodiment.

FIG. 8 is a circuit diagram illustrating a configuration in which a page buffer PB1 is one of the page buffers PB1 to PBm, described above with reference to FIG. 2. The page buffer PB1 may include a bit line voltage controller and a latch group.

In an embodiment, the bit line voltage controller may include first to eighth transistors T1 to T8. In detail, the first transistor T1 may be controlled in response to a first control signal PBSENSE. The second transistor T2 may be controlled in response to a first precharge signal CSOC. The third transistor T3 may be controlled according to the potential of a node QS of a first latch circuit. The fourth transistor T4 may be controlled in response to a second precharge signal PRE_N. The fifth transistor T5 may be controlled in response to a second control signal SENSE. The sixth transistor T6 may be controlled according to the potential of the node QS of the first latch circuit. The seventh transistor T7 may be controlled in response to a third precharge signal DPGM_REF. The eighth transistor T8 may be controlled in response to a discharge signal DIS.

The bit line voltage controller may be coupled to a memory cell through a bit line BL, and may control the potential of the bit line BL. For example, the bit line voltage controller may perform a bit line precharge operation of increasing the potential of the bit line BL to a preset voltage. The bit line voltage controller may perform a bit line discharge operation of decreasing the potential of the precharged bit line BL to a preset voltage or a bit line floating operation of maintaining the potential of the bit line BL. The bit line precharge operation, the bit line discharge operation, and the bit line floating operation may correspond to a bit line setup operation of setting the potential of the bit line BL to perform the operation of the memory cell.

The bit line voltage controller may perform the bit line precharge operation of precharging the potential of the bit line BL to a supply voltage VCORE depending on the first and second control signals PBSENSE and SENSE, the first and second precharge signals CSOC and PRE_N, and the potential of the node QS of the first latch circuit. The supply voltage VCORE may be a program inhibition voltage that is applied to the bit line so that the program operation on the memory cell is restricted.

The bit line voltage controller may perform the bit line precharge operation of precharging the potential of the bit line BL to a voltage Vm depending on the first control signal PBSENSE, the third precharge signal DPGM_REF, and the potential of the node QS of the first latch circuit. The voltage Vm may be a first program permission voltage that is applied to the bit line BL so that the program operation on the memory cell is performed at low speed.

The bit line voltage controller may perform the bit line discharge operation of discharging the potential of the bit line BL to a ground voltage Vgnd depending on the first control signal PBSENSE, the discharge signal DIS, and the potential of the node QS of the first latch circuit. The ground voltage Vgnd may be a second program permission voltage that is applied to the bit line BL so that the program operation on the memory cell is performed at high speed. The second program permission voltage may be a voltage having a level lower than that of the first program permission voltage.

The bit line voltage controller may perform the bit line floating operation of maintaining the potential of the precharged bit line BL in response to the first control signal PBSENSE. For example, when the first control signal PBSENSE is at a low level, the first transistor T1 may be turned off, and the potential of the bit line BL may be maintained at the precharged voltage.

In an embodiment, the bit line voltage controller may perform the bit line precharge operation, the bit line discharge operation, and the bit line floating operation depending on the data corresponding to the state mode, stored in the latch group. The state mode may be determined depending on the result of verifying the program operation on the memory cell. The state mode may include a first program mode (PGM Mode), a second program mode (DPGM Mode), and a program inhibit mode (Inhibit Mode).

In an embodiment, the latch group may include first and second latch circuits.

The first latch circuit may include a ninth transistor T9, two inverters, and transistors (not illustrated) for setting or resetting the potential of the node QS of the first latch circuit. The second latch circuit may include a tenth transistor T10, two inverters, and transistors (not illustrated) for setting or resetting the potential of the node QD of the second latch circuit. The ninth transistor T9 may be controlled in response to a first transfer signal TRANS, and the tenth transistor T10 may be controlled in response to a second transfer signal TRAND.

The latch group may sense and store the potential of a sensing node SO, and then store the result of sensing the threshold voltage of the memory cell. In detail, the potential of the bit line BL determined based on the threshold voltage of the memory cell in a sensing operation may be transferred to a common node CSO in response to the first control signal PBSENSE. The potential transferred to the common node CSO may be transferred to the sensing node SO in response to the second control signal SENSE. The potential of the bit line BL, which is the result of sensing the threshold voltage of the memory cell, may be amplified while being transferred to the sensing node SO. The latch group may selectively store the result of sensing the potential of the sensing node SO in the first latch circuit or the second latch circuit in response to the first and second transfer signals TRANS and TRAND. In various embodiments, the latch group may store the result of sensing the current of the sensing node SO.

In an embodiment, the latch group may store data corresponding to the state mode of the memory cell that is determined depending on the result of verifying the program operation on the memory cell. The state mode may include a first program mode (PGM Mode), a second program mode (DPGM Mode), and a program inhibit mode (Inhibit Mode).

In detail, when the state mode is the program inhibit mode (Inhibit Mode), the first latch circuit may store a logic value of '0'. The potential of the node QS of the first latch circuit may be a low level. When the state mode is the first program mode (PGM Mode), the first latch circuit may store a logical data value of '1', and the second latch circuit may store a logic data value of '1'. The potential of the node QS of the first latch circuit may be a high level, and the potential of the node QD of the second latch circuit may be a high level. When the state mode is the second program mode (DPGM Mode), the first latch circuit may store a logical data value of '1', and the second latch circuit may store a logic data value of '0'. The potential of the node QS of the first latch circuit may be a high level, and the potential of the node QD of the second latch circuit may be a low level. When the bit line discharge operation or bit line floating operation is performed after the bit line precharge operation has been performed, the potential of the node QD of the second latch circuit may be transferred to the node QS of the first latch circuit.

In an embodiment, when the state mode is the program inhibit mode (Inhibit Mode), the potential of the node QS of the first latch circuit is a low level, and thus the third transistor T3 may be turned on, and the sixth transistor T6 may be turned off. Therefore, the bit line precharge operation of increasing the potential of the bit line BL to the supply voltage VCORE may be performed in response to the first and second control signals PBSENSE and SENSE and first and second precharge signals CSOC and PRE_N.

In the case of the program-inhibit mode (Inhibit Mode), after the bit line precharge operation has been performed, the bit line floating operation of maintaining the potential of the bit line BL precharged to the supply voltage VCORE may be performed in response to the first control signal PBSENSE.

In an embodiment, when the state mode is the first program mode (PGM Mode), the potential of the node QS of the first latch circuit is a high level, and thus the third transistor T3 may be turned off, and the sixth transistor T6 may be turned on. Therefore, the bit line precharge operation of increasing the potential of the bit line BL to a first program permission voltage Vm may be performed in response to the first control signal PBSENSE and the third precharge signal DPGM_REF.

In the case of the first program mode (PGM Mode), the potential of the node QS of the first latch circuit after the bit line precharge operation has been performed may be maintained at a high level. The reason for this is that the high-level potential of the node QD of the second latch circuit is transferred to the node QS of the first latch circuit. Because the potential of the node QS of the first latch circuit is a high level, the sixth transistor T6 may be turned on. Therefore, the bit line discharge operation of decreasing the potential of the bit line BL precharged to the first program permission voltage Vm to the ground voltage Vgnd may be performed in response to the first control signal PBSENSE and the discharge signal DIS.

In an embodiment, when the state mode is the second program mode (DPGM Mode), the potential of the node QS of the first latch circuit is a high level, and thus the third transistor T3 may be turned off, and the sixth transistor T6 may be turned on. Therefore, the bit line precharge operation of increasing the potential of the bit line BL to the first program permission voltage Vm may be performed in response to the first control signal PBSENSE and the third precharge signal DPGM_REF.

In the case of the second program mode (DPGM Mode), the potential of the node QS of the first latch circuit after the bit line precharge operation has been performed may make a transition to a low level. The reason for this is that the low-level potential of the node QD of the second latch circuit is transferred to the node QS of the first latch circuit. Because the potential of the node QS of the first latch circuit is a low level, the sixth transistor T6 may be turned off. Therefore, the bit line floating operation of maintaining the potential of the bit line BL precharged to the first program permission voltage Vm may be performed in response to the first control signal PBSENSE.

Figure 9:
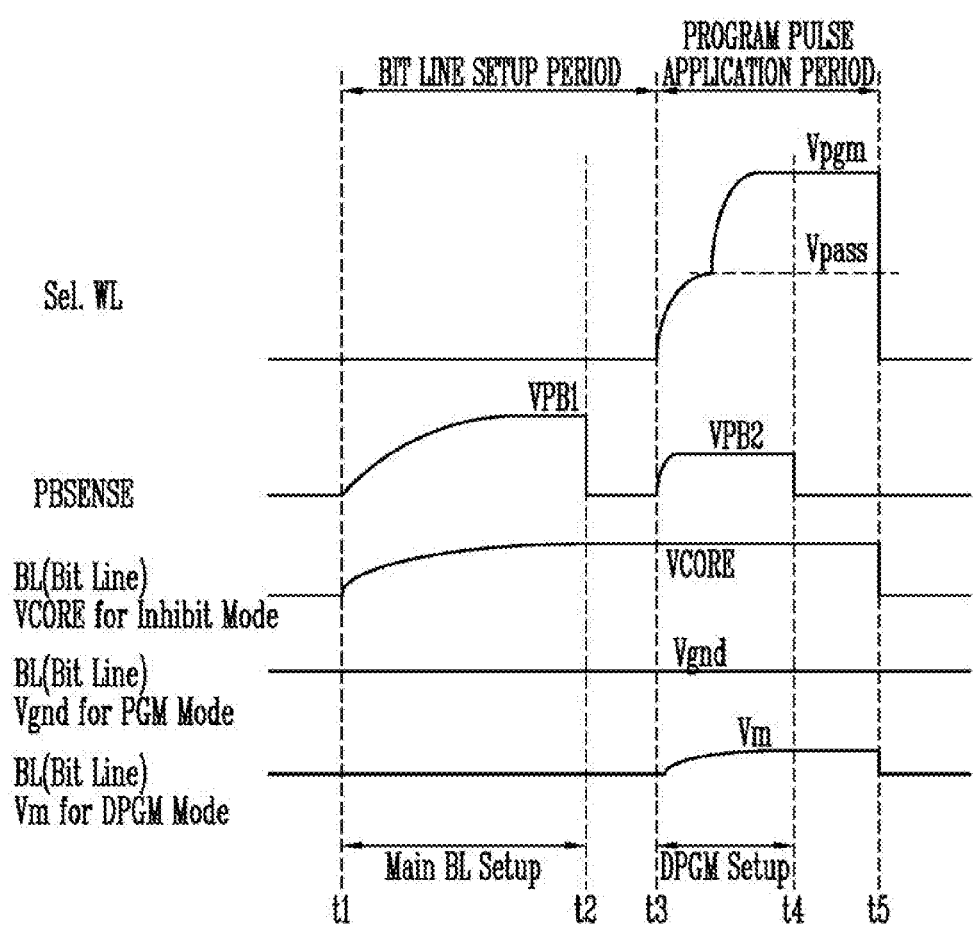
FIG. 9 is a timing diagram of a memory device according to an embodiment.

FIG. 9 is a timing diagram of a memory device according to an embodiment.

Referring to FIG. 9, a program operation may include a bit line setup period and a program pulse application period.

During the bit line setup period, the potentials of bit lines coupled to memory cells in a selected word line may be set to voltages used for a program operation. During the bit line setup period, a bit line precharge operation of increasing the potential of each bit line, a bit line discharge operation of decreasing the potential of the bit line, and a bit line floating operation of maintaining the potential of the precharged bit line may be performed.

During the program pulse application period, the operation of applying a program voltage to the selected word line may be performed.

During an interval from a first time t1 to a second time t2, a main bit line setup operation may be performed. For the main bit line setup operation, a page buffer control signal PBSENSE may be increased to a first control voltage VPB1.

The main bit line may include a first bit line and a program inhibit bit line. The first bit line may be a bit line coupled to a memory cell, for which the state mode, described above with reference to FIG. 7, is a first program mode (PGM Mode). The program inhibit bit line may be a bit line coupled to the memory cell, the state mode of which is a program inhibit mode (Inhibit Mode).

During the interval from the first time t1 to the second time t2, the level of the first bit line may be set to a second program permission voltage. The second program permission voltage may be a ground voltage Vgnd. The program inhibit bit line may be precharged to the program inhibition voltage. The program inhibition voltage may be a supply voltage VCORE.

During an interval from the second time t2 to a third time t3, the page buffer control signal PBSENSE may make a transition to a low level. Here, the first bit line and the program inhibit bit line may float. The potential of the first bit line may be maintained at the second program permission voltage. The potential of the program inhibit bit line may be maintained at the program inhibition voltage.

During an interval from the third time t3 to a fourth time t4, a second bit line setup operation may be performed. For the second bit line setup operation, the page buffer control signal PBSENSE may be increased from a low level to a second control voltage VPB2.

The second bit line may be a bit line coupled to a memory cell, the state mode of which is the second program mode (DPGM Mode). The second bit line may be precharged to the first program permission voltage. The first program permission voltage may be a voltage Vm having a level higher than the second program permission voltage.

During an interval from the fourth time t4 to a fifth time t5, the page buffer control signal PBSENSE may make a transition to a low level. In this case, the second bit line may float. The potential of the second bit line may be maintained at the first program permission voltage.

During an interval from the third time t3 to the fifth time t5, a program pulse may be applied to a selected word line SEL. WL. After the potential of the selected word line SEL. WL has increased to a pass voltage Vpass together with the potential of an unselected word line, it may increase to a program voltage Vpgm. After the potential of the unselected word line (not illustrated) has increased to a pass voltage Vpass, it may be maintained at the pass voltage Vpass.

In an embodiment, the program operation on the memory cells may be performed differently depending on the program voltage Vpgm applied to the selected word line and a bit line voltage applied to the bit line.

A program operation with high strength may be performed on a memory cell coupled to the first bit line, among individual bit lines, because a potential difference between the program voltage Vpgm and the second program permission voltage Vgnd is largest. A program operation with low strength may be performed on a memory cell coupled to the second bit line because a potential difference between the program voltage Vpgm and the first program permission voltage Vm is relatively small. A program operation may not be performed on a memory cell coupled to the program inhibit bit line because the potential difference between the program voltage Vpgm and the program inhibition voltage VCORE is smallest.

Figure 10:
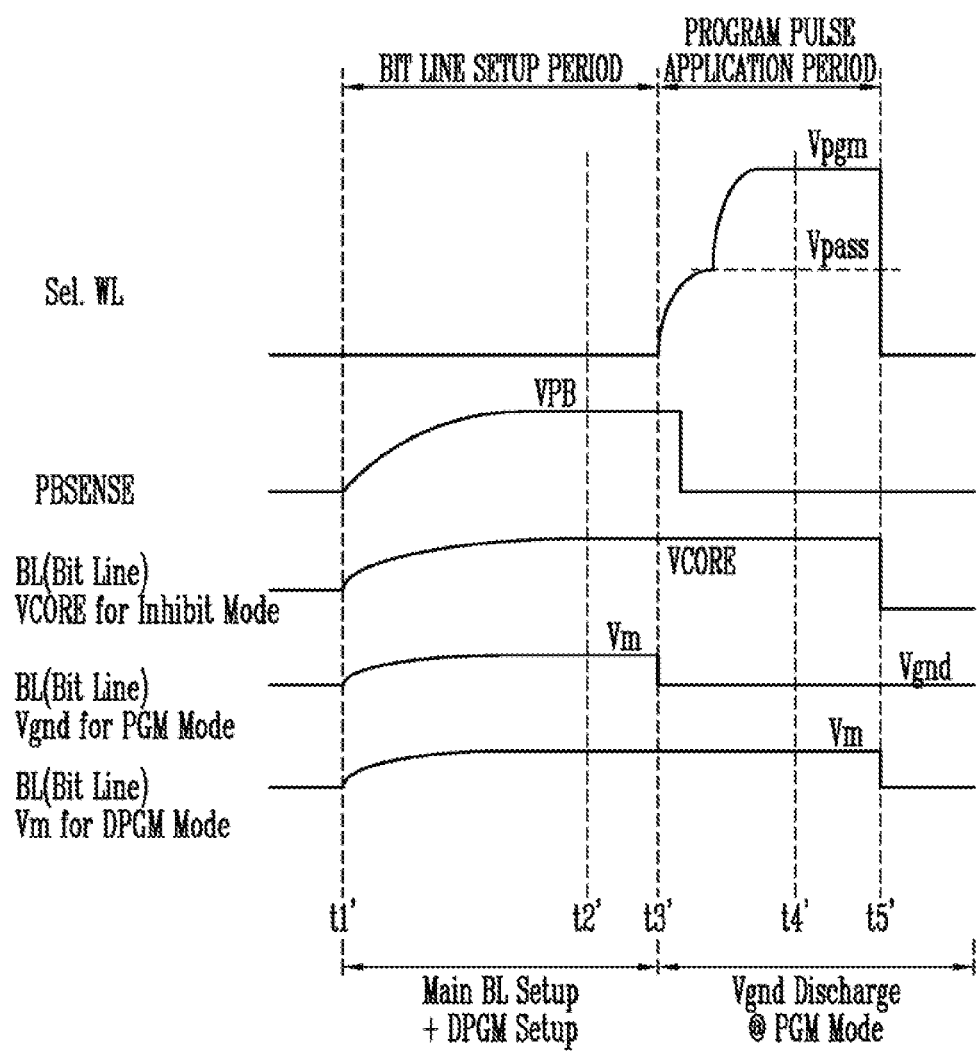
FIG. 10 is a timing diagram of a memory device according to an embodiment.

FIG. 10 is a timing diagram of a memory device according to an embodiment.

Referring to FIGS. 10 and 9, during an interval from a first time t1' to a third time t3', a setup operation may be performed on a first bit line, a second bit line, and a program inhibit bit line.

During the interval from the first time t1' to the third time t3', the page buffer control signal PBSENSE may be increased to a control voltage VPB so as to perform a bit line setup operation.

During the interval from the first time t1' to the third time t3', a bit line precharge operation of increasing the potential of the program inhibit bit line to the program inhibition voltage may be performed. The bit line precharge operation of increasing the potentials of the first and second bit lines to the first program permission voltage Vm may be performed. After the bit line precharge operation has been completed, a bit line discharge operation of decreasing the potential of the first bit line to the second program permission voltage Vgnd may be performed. A time at which the bit line discharge operation is performed may be a time after the potential of the first bit line has been precharged to the first program permission voltage Vm. In various embodiments, the time at which the bit line discharge operation is performed may be a time before the program pulse is applied to the selected word line Sel. WL.

During an interval from a time at which a predetermined time has elapsed from the third time t3' to the fifth time t5', the page buffer control signal PBSENSE may make a transition to a low level. Therefore, each of the first bit line, the second bit line, and the program inhibit bit line may float. The potential of the program inhibit bit line precharged to the program inhibition voltage VCORE may be maintained. The potential of the second bit line precharged to the first program permission voltage Vm may be maintained. The potential of the first bit line discharged to the second program permission voltage Vgnd may be maintained.

In FIG. 10, the problem of bit line capacitance occurring due to the potential difference between bit lines during a bit line setup period may be solved in comparison with the embodiment of FIG. 9. The bit line capacitance may be further reduced as the potential difference between bit lines becomes smaller.

In FIG. 10, the potential difference between bit lines may be decreased to the difference between the supply voltage VCORE and the first program permission voltage Vm, which may become less than the potential difference between the bit lines in FIG. 9, that is, the difference between the supply voltage VCORE and the second program permission voltage Vgnd.

Also, in FIG. 10, a sufficient amount of time to precharge the second bit line may be secured in comparison with the case of FIG. 9.

In FIG. 10, during the interval from the first time t1' to the third time t3', the potential of the second bit line may be precharged, and thus a sufficient precharge time may be secured in comparison with the case of FIG. 9 where the potential of the second bit line is precharged during the interval from the third time t3 to the fourth time t4. Therefore, during the bit line precharge operation, the potential of the second bit line may stably reach the first program permission voltage Vm.

Figure 11:
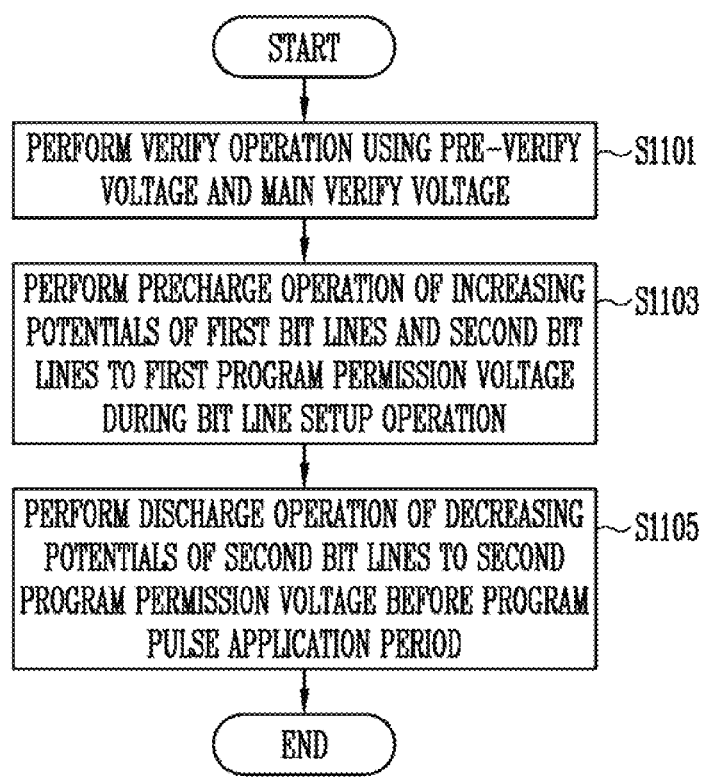
FIG. 11 is a flowchart illustrating the operation of a memory device according to an embodiment.

FIG. 11 is a flowchart illustrating the operation of a memory device according to an embodiment.

Referring to FIG. 11, at S1101, the memory device may perform a verify operation using a pre-verify voltage and a main verify voltage. As a result of performing the verify operation, a bit line coupled to a memory cell having a threshold voltage lower than the pre-verify voltage may be a first bit line. A bit line coupled to a memory cell having a threshold voltage that is higher than the pre-verify voltage and is lower than the main verify voltage may be a second bit line. A bit line coupled to a memory cell having a threshold voltage higher than the main verify voltage may be a program inhibit bit line.

At S1103, the memory device may perform a precharge operation of increasing the potentials of first bit lines and second bit lines to the first program permission voltage during the bit line setup operation. The first program permission voltage may be a voltage higher than the second program permission voltage.

At S1105, the memory device perform a discharge operation of decreasing the potentials of the second bit lines to a second program permission voltage before applying a program pulse to a word line coupled to the memory cells. The second program permission voltage may be a ground voltage.

Figure 12:
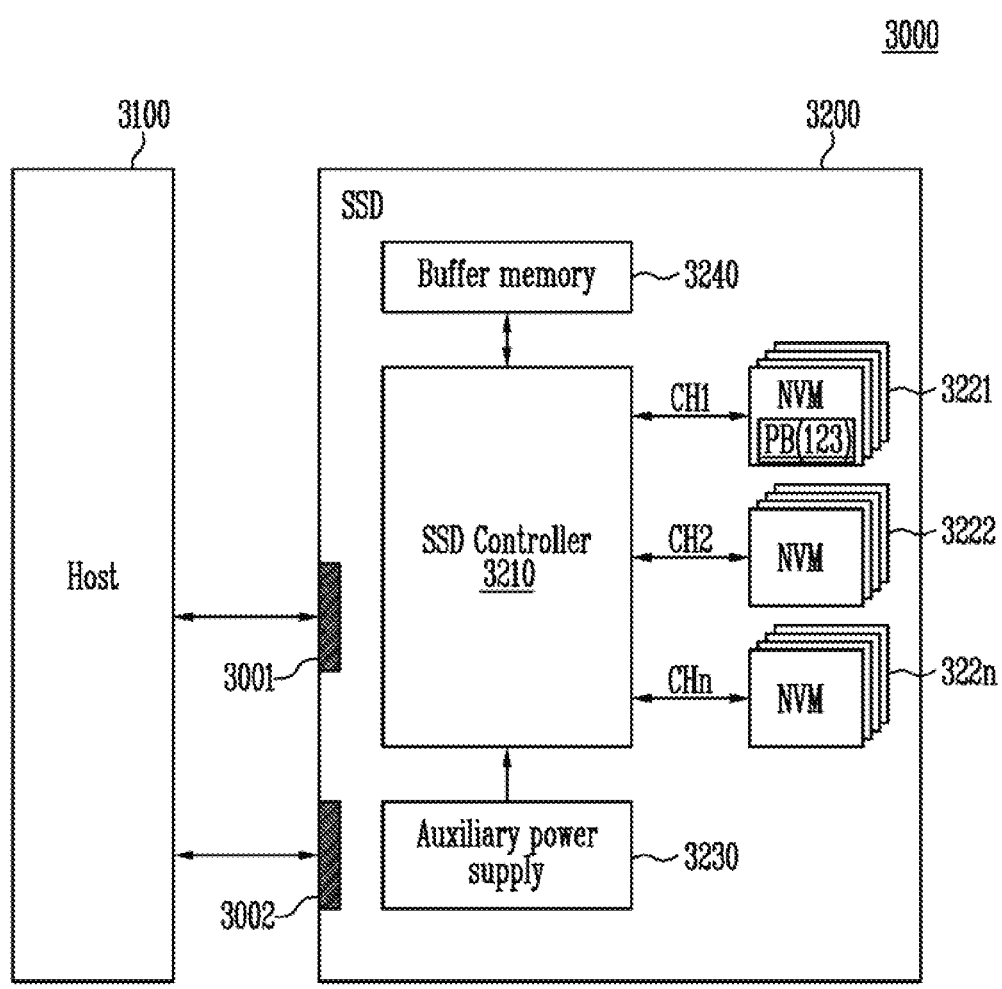
FIG. 12 is a block diagram illustrating a solid state drive (SSD) system to which a storage device according to an embodiment of the present disclosure is applied.

FIG. 12 is a block diagram illustrating an example of a solid state drive (SSD) system to which a storage device according to an embodiment of the present disclosure is applied.

Referring to FIG. 12, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may perform the function of the memory controller 200 described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n.

In an embodiment, each of the flash memories 3221 to 322n may correspond to the memory device 100, described above with reference to FIGS. 1 to 4. In an example, the flash memory 3221 may include a page buffer circuit PB described above with reference to FIG. 8. Each of the flash memories 3221 to 322n may have improved program operation performance according to an embodiment of the present disclosure.

The buffer memory 3240 may include volatile memories, such as a DRAM, SDRAM, DDR SDRAM, LPDDR SDRAM, and GRAM, or nonvolatile memories, such as an FRAM, ReRAM, STT-MRAM, and PRAM.

In accordance with the present disclosure, there are provided a page buffer having improved program operation performance, a memory device including the page buffer, and a method of operating the memory device.

What is claimed is:

1. A memory device, comprising:
a voltage generator configured to generate operating voltages for operating a plurality of memory cells;
a program and verify circuit configured to apply the operating voltages to respective word lines and bit lines coupled to the plurality of memory cells and configured to perform a program operation and a verify operation on the plurality of memory cells; and
a program operation controller configured to control the program and verify circuit and the voltage generator to perform a bit line precharge operation and to perform a bit line discharge operation after the bit line precharge operation has been completed,
wherein the bit line precharge operation increases a potential of a bit line coupled to a program-inhibited cell, among the plurality of memory cells, to a program inhibition voltage and increases potentials of bit lines coupled to first and second program cells to a first program permission voltage, and
wherein the bit line discharge operation decreases the potential of the bit line coupled to the first program cell to a second program permission voltage.

2. The memory device according to claim 1, wherein:
the first program permission voltage is higher than the second program permission voltage, and
the second program permission voltage is a ground voltage.

3. The memory device according to claim 1, wherein the voltage generator is configured to generate a pre-verify voltage and a main verify voltage for the verify operation.

4. The memory device according to claim 3, wherein the program and verify circuit is configured to perform the verify operation using the pre-verify voltage and the main verify voltage.

5. The memory device according to claim 4, wherein:
the main verify voltage is a verify voltage corresponding to a target state of the program operation, and
the pre-verify voltage is lower than the main verify voltage.

6. The memory device according to claim 5, wherein:
the first program cell is a memory cell having a threshold voltage lower than the pre-verify voltage,
the second program cell is a memory cell having a threshold voltage higher than the pre-verify voltage and lower than the main verify voltage, and
the program-inhibited cell is a memory cell having a threshold voltage higher than the main verify voltage.

7. The memory device according to claim 1, wherein the program operation controller is configured to, when the bit line discharge operation is completed, control the program and verify circuit to perform a program pulse application on a word line coupled to the plurality of memory cells.

8. A method of operating a memory device for performing a program operation on a plurality of memory cells, the method comprising:
performing a bit line precharge operation of increasing potentials of bit lines coupled to first and second program cells, among the plurality of memory cells, to a first program permission voltage; and
performing, after completion of the bit line precharge operation, a bit line discharge operation of decreasing the potential of the bit line coupled to the first program cell to a second program permission voltage,
wherein the first program cell and the second program cell are programmed into a same program state.

9. The method according to claim 8, wherein:
the first program permission voltage is higher than the second program permission voltage, and
the second program permission voltage is a ground voltage.

10. The method according to claim 8, further comprising:
performing a verify operation on the plurality of memory cells using a pre-verify voltage or a main verify voltage,
wherein the main-verify voltage is a verify voltage corresponding to a target state of the program operation, and
wherein the pre-verify voltage is lower than the main verify voltage.

11. The method according to claim 10, wherein:
the first program cell is a memory cell having a threshold voltage lower than the pre-verify voltage,
the second program cell is a memory cell having a threshold voltage higher than the pre-verify voltage and lower than the main verify voltage, and
a program-inhibited cell is a memory cell having a threshold voltage higher than the main verify voltage.

12. The method according to claim 11, wherein performing the bit line precharge operation further comprises:
increasing a potential of a bit line coupled to the program-inhibited cell, among the plurality of memory cells, to a program inhibition voltage, wherein the program inhibition voltage is a supply voltage.

13. The method according to claim 12, further comprising:
allowing, after completion of the bit line precharge operation, a bit line coupled to the second program cell and the bit line coupled to the program-inhibited cell to float.

14. The method according to claim 8, further comprising:
applying, after completion of the bit line discharge operation, a program pulse to a word line coupled to the plurality of memory cells.

15. A page buffer circuit, comprising:
a bit line voltage controller configured to control a voltage of a bit line coupled to a memory cell during a program operation on the memory cell; and
a latch group configured to store data corresponding to a state mode of the memory cell determined based on a result of verifying the program operation,
wherein the bit line voltage controller is configured to, when the latch group stores data corresponding to program modes among state modes, precharge the bit line to a first program permission voltage and discharge the bit line to a second program permission voltage depending on the data before a program pulse is applied to a word line coupled to the memory cell,
wherein the state mode of the memory cell indicates a degree to which the memory cell has been programed.

16. The page buffer circuit according to claim 15, wherein:
the first program permission voltage is higher than the second program permission voltage, and
the second program permission voltage is a ground voltage.

17. The page buffer circuit according to claim 15, wherein the latch group is configured to, when a threshold voltage of the memory cell is lower than a pre-verify voltage, store data corresponding to a first program mode among the program modes, and when the threshold voltage is higher than the pre-verify voltage and lower than a main verify voltage, store data corresponding to a second program mode among the program modes.

18. The page buffer circuit according to claim 17, wherein the bit line voltage controller is configured to, when the latch group stores data corresponding to the first program mode, discharge the bit line to the second program permission voltage before the program pulse is applied.

19. The page buffer circuit according to claim 17, wherein the bit line voltage controller is configured to, when the latch group stores data corresponding to the second program mode, allow the bit line to float before the program pulse is applied.

20. The page buffer circuit according to claim 17, wherein:
the latch group is configured to, when a threshold voltage of the memory cell is higher than the main verify voltage, store data corresponding to a program inhibit mode among the state modes; and
the bit line voltage controller is configured to, when the latch group stores the data corresponding to the program inhibit mode, precharge the bit line to a program inhibition voltage that is a supply voltage and allow the bit line to float before the program pulse is applied.

* * * * *